(12) United States Patent
Potter et al.

(10) Patent No.: US 11,054,317 B2
(45) Date of Patent: Jul. 6, 2021

(54) METHOD AND APPARATUS FOR DIRECT MEASUREMENT OF CHUCKING FORCE ON AN ELECTROSTATIC CHUCK

(71) Applicant: Applied Materials, Inc., Santa Clara, CA (US)

(72) Inventors: Charles G. Potter, Santa Clara, CA (US); Wendell Glenn Boyd, Jr., Morgan Hill, CA (US); Govinda Raj, Santa Clara, CA (US); Robert Hirahara, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/566,409

(22) Filed: Sep. 10, 2019

(65) Prior Publication Data

US 2020/0103294 A1    Apr. 2, 2020

Related U.S. Application Data

(60) Provisional application No. 62/738,737, filed on Sep. 28, 2018.

(51) Int. Cl.
*G01L 1/04* (2006.01)
*G01L 1/16* (2006.01)
*H01L 21/683* (2006.01)

(52) U.S. Cl.
CPC .............. *G01L 1/04* (2013.01); *G01L 1/16* (2013.01); *H01L 21/6833* (2013.01)

(58) Field of Classification Search
CPC ... H01L 21/6831; H01L 21/6833; G01L 1/04; G01L 1/16; G01L 9/0042; G01L 9/0073; B81B 7/007; B81C 1/00301

(Continued)

(56) References Cited

U.S. PATENT DOCUMENTS 6,853,953 B2 *  2/2005  Brcka ................ H01L 21/6831
                                                   700/108
7,770,478 B2 *  8/2010  Son .................... H01L 21/6831
                                                   361/234

(Continued)

FOREIGN PATENT DOCUMENTS

KR    10-2018-0050467       5/2018

OTHER PUBLICATIONS

International Search Report and Written Opinion from Patent Application No. PCT/US2019/050629 dated Jan. 21 2020, 13 pgs.

(Continued)

*Primary Examiner* — Octavia Hollington
(74) *Attorney, Agent, or Firm* — Schwabe, Williamson & Wyatt, P.C.

(57) ABSTRACT

Disclosed herein is a method of measuring the chucking force of an electrostatic chuck. The method comprises placing a sensor wafer onto the electrostatic chuck, wherein the sensor wafer comprises a plurality of pressure sensors, and applying a chucking voltage to the electrostatic chuck. The method further comprises measuring the chucking force with the plurality of pressure sensors to determine a first chucking force profile of the electrostatic chuck, and processing a plurality of wafers on the electrostatic chuck. The method further comprises placing the sensor wafer onto the electrostatic chuck, and applying the chucking voltage to the electrostatic chuck. The method further comprises measuring the chucking force with the plurality of pressure sensors to determine a second chucking force profile of the electrostatic chuck.

17 Claims, 7 Drawing Sheets

(58) Field of Classification Search
USPC .................................................. 73/862.636
See application file for complete search history.

(56) References Cited

U.S. PATENT DOCUMENTS

| | | |
|---|---|---|
| 2007/0046284 A1 | 3/2007 | Renken et al. |
| 2009/0107250 A1 | 4/2009 | Son |
| 2010/0248398 A1 | 9/2010 | Wang et al. |
| 2016/0103541 A1* | 4/2016 | Andrews ............. G06F 3/04144 345/173 |
| 2016/0149105 A1* | 5/2016 | Van Buggenhout .... H01L 31/09 257/429 |
| 2016/0229685 A1* | 8/2016 | Boysel .................... B81B 7/007 |
| 2016/0327446 A1* | 11/2016 | Classen ............... G01L 19/0636 |
| 2016/0341616 A1* | 11/2016 | Classen ................ G01L 9/0042 |
| 2017/0365495 A1 | 12/2017 | Sun et al. |
| 2018/0330926 A1* | 11/2018 | Boyd, Jr. .......... H01L 21/67259 |

OTHER PUBLICATIONS

International Preliminary Report of Patentability from Patent Application No. PCT/US2019/050629 dated Apr. 8, 2021, 9 pgs.

* cited by examiner

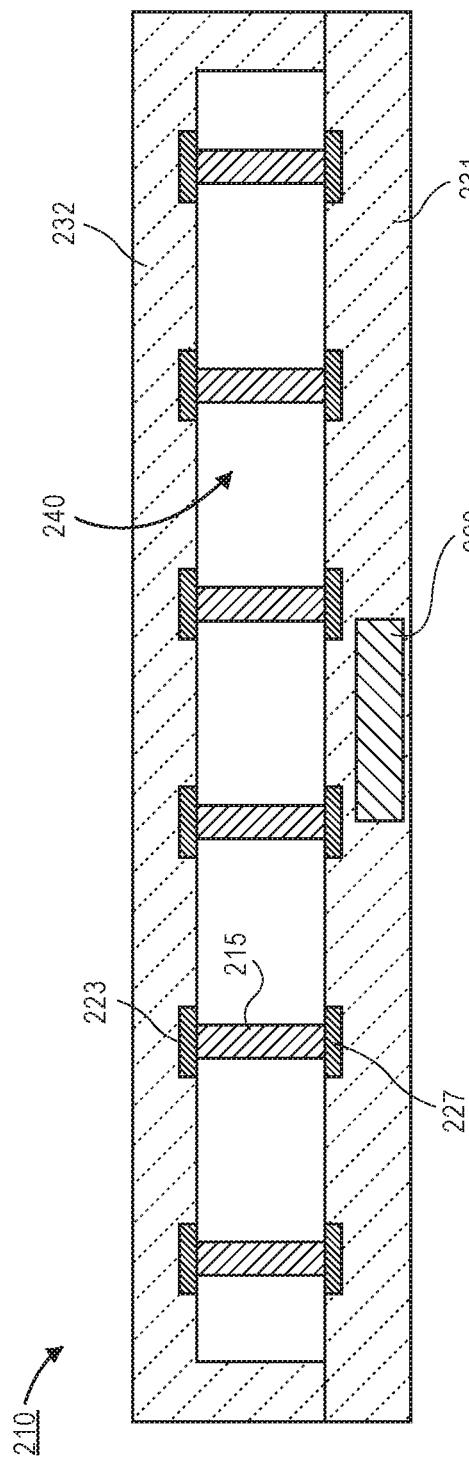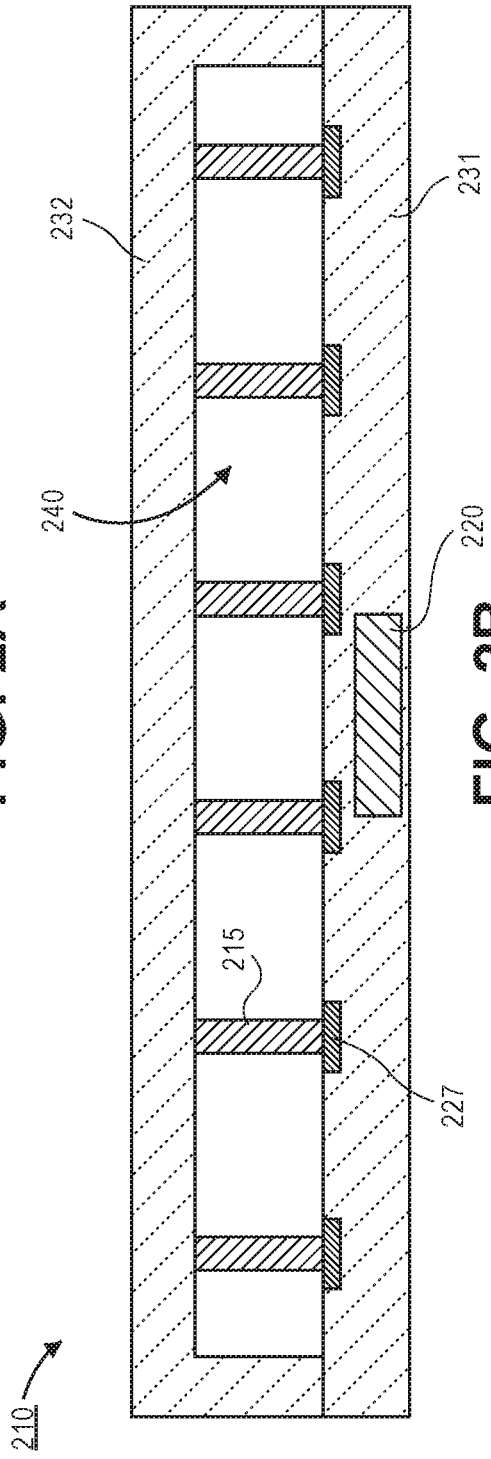

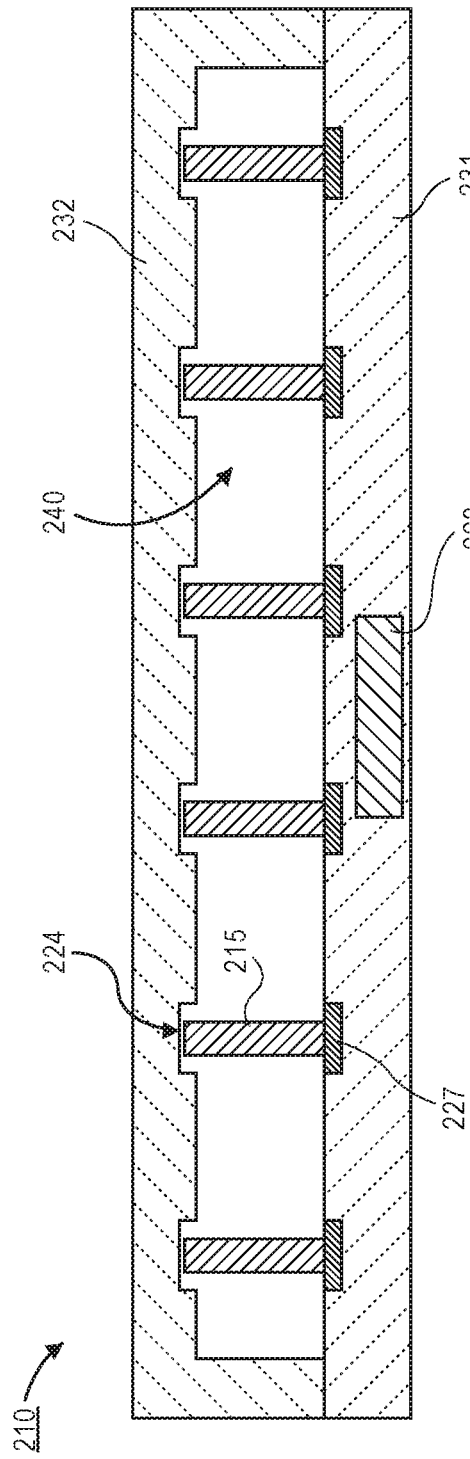
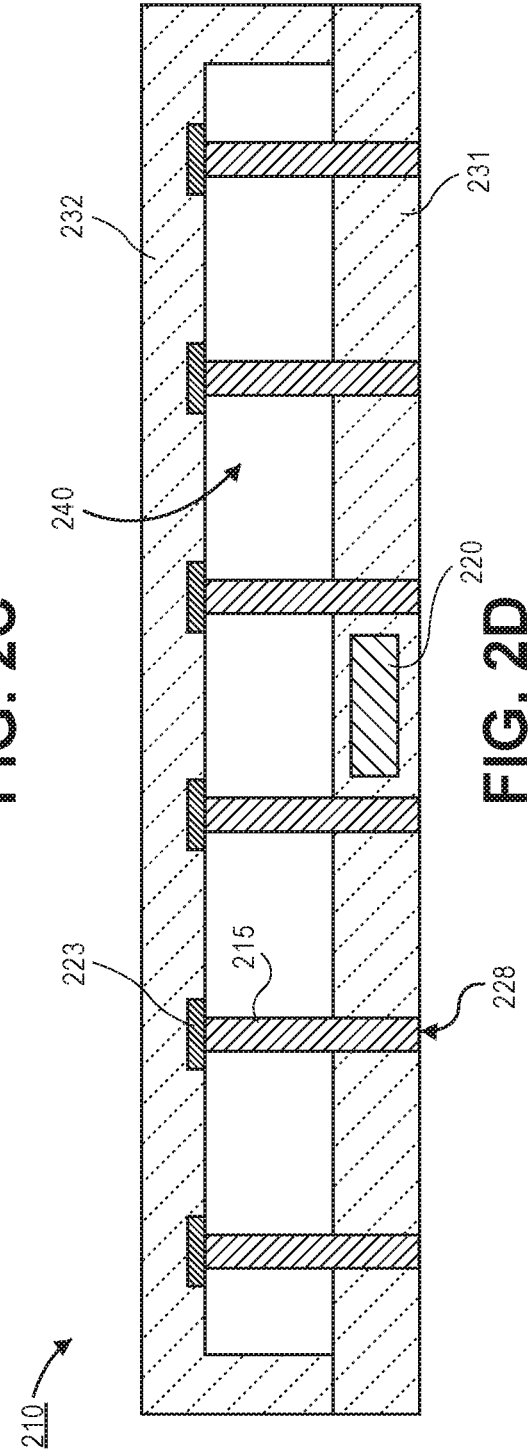

METHOD AND APPARATUS FOR DIRECT MEASUREMENT OF CHUCKING FORCE ON AN ELECTROSTATIC CHUCK

CROSS REFERENCE TO RELATED APPLICATIONS

This application claims priority to U.S. Provisional Application No. 62/738,737, filed on Sep. 28, 2018, the entire contents of which are hereby incorporated by reference herein.

BACKGROUND

1) Field

Embodiments relate to the field of semiconductor manufacturing and, in particular, to methods and apparatuses for measuring the chucking force of an electrostatic chuck.

2) Description of Related Art

In the processing of substrates, such as semiconducting wafers, the wafers are secured to a chuck during processing. Often, the chuck is an electrostatic chuck, and the chucking force is an electrostatic force. Currently, there is no way to accurately measure the chucking force across the wafer. The only way to monitor the chucking force is to reduce the chucking voltage until the force is not sufficient to hold the wafer to the electrostatic chuck, and backside helium flow increases. Such a process only provides a measure of the minimum chucking voltage to secure the wafer. Accordingly, it is not possible to measure chucking force uniformity. Additionally, it is not possible to compare the chucking force between chambers in order to provide chamber matching information.

SUMMARY

Embodiments disclosed herein include a method of measuring the chucking force of an electrostatic chuck. In an embodiment, the method comprises placing a sensor wafer onto the electrostatic chuck, wherein the sensor wafer comprises a plurality of pressure sensors, and applying a chucking voltage to the electrostatic chuck. In an embodiment, the method further comprises measuring the chucking force with the plurality of pressure sensors to determine a first chucking force profile of the electrostatic chuck, and processing a plurality of wafers on the electrostatic chuck. In an embodiment, the method further comprises placing the sensor wafer onto the electrostatic chuck, and applying the chucking voltage to the electrostatic chuck. In an embodiment, the method further comprises measuring the chucking force with the plurality of pressure sensors to determine a second chucking force profile of the electrostatic chuck.

Embodiments disclosed herein include a sensor wafer for measuring chucking forces. In an embodiment, the sensor wafer comprises a first substrate, a second substrate over the first substrate, where surfaces of the first substrate and the second substrate define a cavity between the first substrate and the second substrate, and a plurality of pressure sensors in the cavity.

Embodiments include a method of measuring the chucking force of an electrostatic chuck. In an embodiment, the method comprises placing a sensor wafer onto the electrostatic chuck. In an embodiment, the sensor wafer comprises a first substrate, a second substrate over the first substrate, wherein surfaces of the first substrate and the second substrate define a cavity between the first substrate and the second substrate, and a plurality of pressure sensors in the cavity. In an embodiment, the method further comprises applying a chucking voltage to the electrostatic chuck. In an embodiment, the method further comprises measuring the chucking force with the plurality of pressure sensors to determine a first chucking force profile of the electrostatic chuck.

BRIEF DESCRIPTION OF THE DRAWINGS

FIG. 2A is a cross-sectional illustration of a sensor wafer with a plurality of pressure sensors electrically coupled to a first substrate and a second substrate, in accordance with an embodiment.

FIG. 2B is a cross-sectional illustration of a sensor wafer with a plurality of pressure sensors electrically coupled to a first substrate, in accordance with an embodiment.

FIG. 2C is a cross-sectional illustration of a sensor wafer with a plurality of pressure sensors that are aligned with recesses in the second substrate, in accordance with an embodiment.

FIG. 2D is a cross-sectional illustration of a sensor wafer with a plurality of pressure sensors that pass through the first substrate, in accordance with an embodiment.

DETAILED DESCRIPTION

Systems that include sensor wafers with pressure sensors and methods of using such sensor wafers to measure the chucking force of an electrostatic chuck are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, there are currently no tools that can be used to measure the uniformity of the chucking force of an electrostatic chuck (ESC). Accordingly, it is difficult to monitor performance of an ESC to determine when the ESC needs to be replaced. Additionally, monitoring variations in chucking force between processing tools is also not possible.

Accordingly, embodiments disclosed herein include a sensor wafer that is capable of measuring the uniformity of the chucking force of an ESC. In an embodiment, the sensor wafer may comprise a plurality of pressure sensors that are distributed across the surface of the ESC. Accordingly, the chucking force uniformity across the ESC may be determined. Additionally, sensor wafers disclosed herein allow for the chucking force to be monitored over the lifespan of the ESC. As such, embodiments allow for adjustments to be made to the ESC to compensate for chucking force degradation over time in order to extend the life of the ESC. Monitoring the chucking force with a sensor wafer also allows for ESCs in different chambers to be matched (i.e., chamber matching) in order to improve process uniformity. Furthermore, measurements of the chucking force may be stored and used during the design of new ESCs in order to increase performance of the ESC.

In addition to monitoring the chucking force of an ESC, embodiments disclosed herein provide force measurements for many different processing operations. For example, sensor wafers disclosed herein may also be used to measure the uniformity of vacuum chucking (e.g., for vacuum heating pedestals), and for measuring the force applied during polishing process (e.g., chemical mechanical polishing (CMP) or the like). The measurement of different types of applied force can enable better chamber matching, end of useable life measurements, and recipe modifications to provide improved uniformity, among other benefits.

Figure 1A:
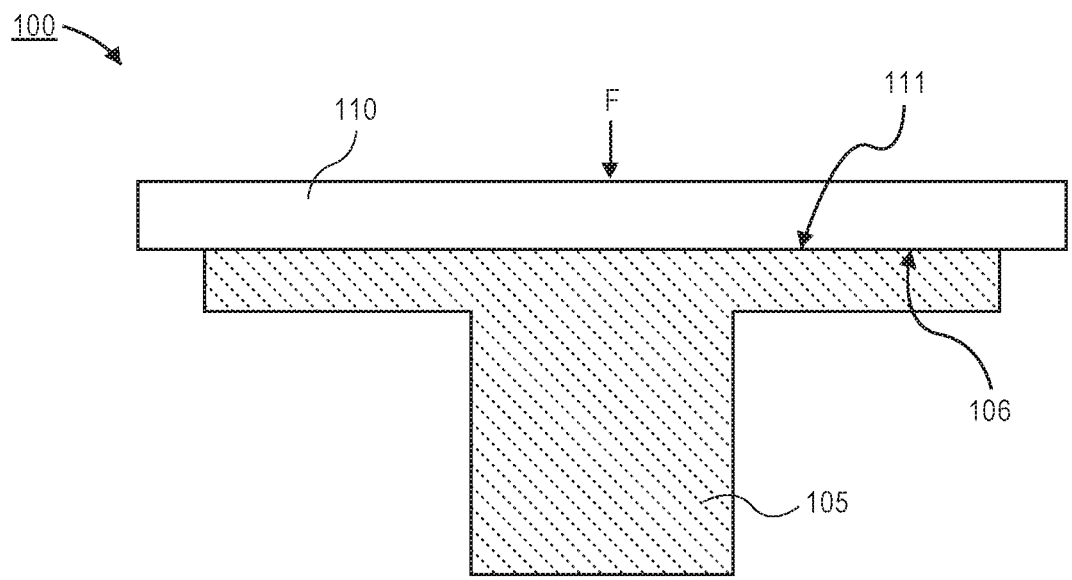
FIG. 1A is a cross-sectional illustration of an electrostatic chuck supporting a sensor wafer, in accordance with an embodiment.

Referring now to FIG. 1A, a cross-sectional illustration of a processing tool 100 is shown, in accordance with an embodiment. In an embodiment, the processing tool 100 may comprise an electrostatic chuck (ESC) 105. The ESC may comprise a support surface 106 on which substrates (e.g., wafers) are secured during processing in the processing tool 100. In an embodiment, the ESC 105 may be any suitable ESC known in the art. For example, the ESC 105 may include features for heating and/or cooling the substrate in addition to securing the substrate.

In the illustrated embodiment, a bottom surface 111 of a sensor wafer 110 is supported by the support surface 106 of the ESC 105. In an embodiment, the ESC 105 secures the sensor wafer 110 to the support surface with an electrostatic force, as indicate by force F. For example, the electrostatic force may result in the bottom surface 111 of the sensor wafer 110 and the support surface 106 being oppositely charged. In an embodiment, the force F may be measured by a plurality of sensors (e.g., pressure sensors) that are embedded in the sensor wafer 110.

In the illustrated embodiment, the sensor wafer 110 has a diameter that is greater than the diameter of the support surface 106 of the ESC 105. However, it is to be appreciated that embodiments may also include a support surface 106 that has a diameter that is larger than the diameter of the sensor wafer 110. In an embodiment, the sensor wafer 110 may have a form-factor that is substantially similar to the form-factor of substrates processed in the processing tool 100. For example, the sensor wafer 110 may have a diameter that is 300 mm. In an embodiment, a thickness of the sensor wafer may be approximately 1.0 mm or less.

Figure 1B:
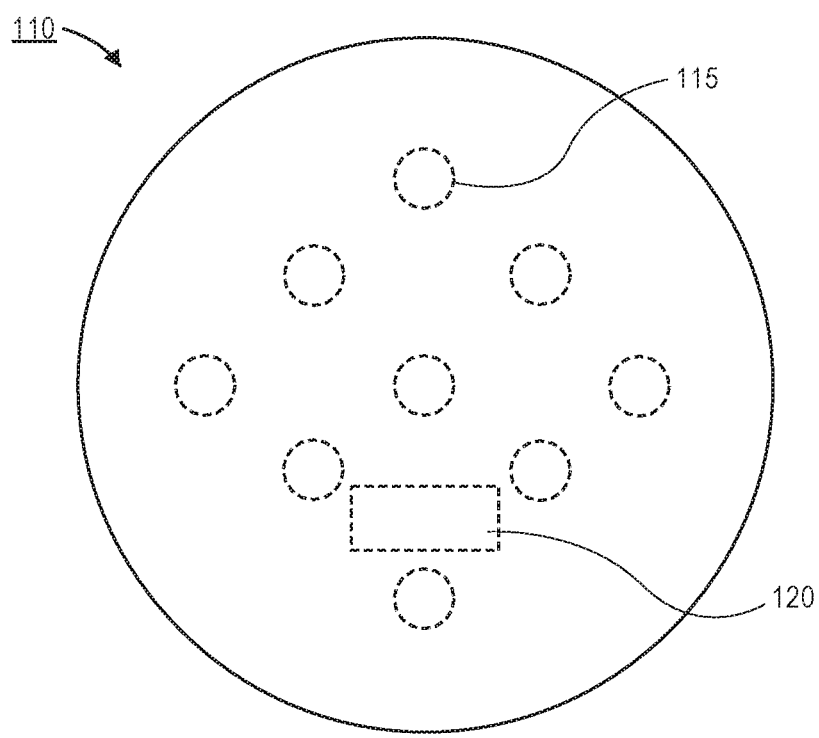
FIG. 1B is a plan view illustration of a sensor wafer with a plurality of embedded sensors for measuring chucking force, in accordance with an embodiment.

Referring now to FIG. 1B, a plan view illustration of the sensor wafer 110 is shown, in accordance with an embodiment. As shown, a plurality of sensors 115 may be distributed across the surface of the sensor wafer 110. In the illustrated embodiment, nine sensors 115 are illustrated. However, it is to be appreciated that any number of sensors may be included in the sensor wafer 110. For example, embodiments may include tens of sensors, hundreds of sensors, or thousands of sensors. The sensors 115 are illustrated with dashed lines in order to indicate that the sensors 115 are embedded within the sensor wafer 110. In an embodiment, the plurality of sensors 115 provides the ability to monitor the uniformity of the chucking force across the sensor wafer. Accordingly, degradation of the chucking force in any area of the ESC may be detected.

In an embodiment, a computing module 120 may also be embedded within the sensor wafer 110. The computing module 120 may comprise components (e.g., a processor and/or a memory) for implementing and recording measurements of the chucking force. In an embodiment, the computing module 120 may also comprise a power source (e.g., a battery) for powering the sensor wafer 110. In some embodiments, the computing module 120 of the sensor wafer 110 may comprise a wireless communication module (e.g., Bluetooth or WiFi). The use of a wireless communication module may allow for chucking force measurements to be transmitted to external computing devices to process and/or store data, as will be described in greater detail below.

Referring now to FIG. 2A, a cross-sectional illustration of a sensor wafer 210 is shown, in accordance with an embodiment. In an embodiment, the sensor wafer 210 may comprise a first substrate 231 and a second substrate 232 that is positioned over the first substrate 231. In an embodiment, surfaces of the first substrate 231 and the second substrate 232 may define a cavity 240. In an embodiment, the plurality of sensors 215 may be positioned in the cavity 240. That is, the plurality of sensors 215 may be positioned between the first substrate 231 and the second substrate 232. Accordingly, as the second substrate 232 is attracted to the ESC by a chucking voltage, the second substrate 232 applies a compressive force on the plurality of sensors 215. By monitoring the plurality of pressure sensors, a chucking force profile across the ESC may be provided.

In an embodiment, the cavity 240 may be hermetically sealed. As such, the sensors 215 may be protected from the environment of the processing tool. Accordingly, the sensor wafer 210 may be suitable for measuring chucking force while exposed to any processing condition (e.g., reactor chemistry and/or plasmas). In an embodiment, the first substrate 231 and the second substrate 232 may be materials suitable for exposure to various processing conditions. For example, the first substrate 231 and the second substrate 232 may comprise silicon. In some embodiments, a protective coating may be formed over the first and/or second substrates 231/232 in order to provide further protection from processing conditions.

In an embodiment, the plurality of sensors 215 may be pressure sensors. For example, the sensors 215 may be spring gauge sensors or the like. In an embodiment, the sensors 215 may comprise a piezoelectric sensor. In an embodiment, the sensors 215 may comprise any microelectromechanical system (MEMS) sensor suitable for measuring pressure.

In an embodiment, the sensors 215 may be discrete components that are mechanically and electrically coupled between the first substrate 231 and the second substrate 232. For example, in FIG. 2A, each sensor 215 may be electrically coupled to a first conductive pad 227 on the first substrate 231 and a second conductive pad 223 on the second substrate 232. In an embodiment, the conductive pads 223/227 may be electrically coupled to the computing module 220 (e.g., by conductive traces (not shown)).

In an additional embodiment, the sensors 215 may be electrically coupled to a single substrate, as shown in FIG. 2B. As shown, each of the sensors 215 may be mechanically coupled between the first substrate 231 and the second substrate 232, but the electrical contacts may be made only to conductive pads 227 on the first substrate 231. Such an embodiment may be beneficial since the second substrate 232 may be easily replaced since none of the circuitry of the sensors is in the second substrate 232. Accordingly, the second substrate 232 may be considered a consumable and replaceable component in order to extend the lifespan of the sensor wafer 210.

Referring now to FIG. 2C, a cross-sectional illustration of a sensor wafer 210 with a plurality of recesses 224 in the second substrate 232 is shown, in accordance with an embodiment. In an embodiment, the recesses 224 may each be aligned with a pressure sensor 215. That is, end regions of each of the pressure sensors 215 may be set into one of the recesses 224.

Referring now to FIG. 2D, a cross-sectional illustration of a sensor wafer 210 with the pressure sensors 215 passing through the first substrate 231 is shown, in accordance with an embodiment. In an embodiment, the pressure sensors 215 may have a bottom surface 228 that is exposed along the bottom surface of the first substrate 231. Accordingly, the pressure sensors 215 may be in direct contact with a surface of the chuck. In such embodiments, as the second substrate 232 is attracted to the chuck (e.g., with an electrostatic force or a vacuum force), the second substrate compresses the pressure sensors 215 against the chuck surface.

Figure 3:
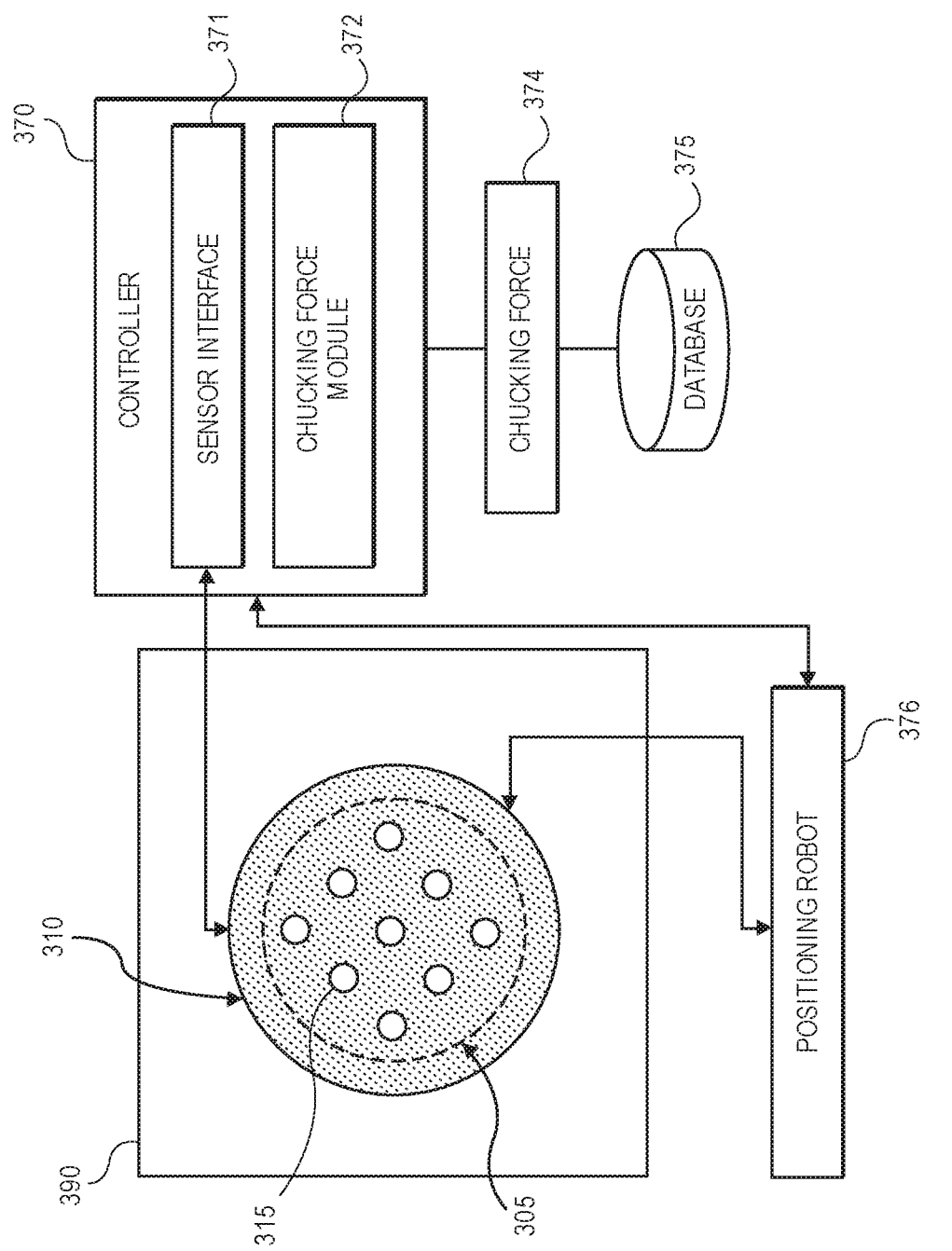
FIG. 3 is a schematic diagram of a processing tool and a controller for determining the chucking force of an electrostatic chuck, in accordance with an embodiment.

Referring now to FIG. 3, a schematic block diagram of a processing tool 390 with the a controller 370 for implementing a process to measure the chucking force of an ESC is shown, in accordance with an embodiment. In an embodiment, an ESC 305 may be located in the processing tool 390. For example, the processing tool 390 may be a plasma processing tool or any other processing tool that utilizes an electrostatic chuck.

In an embodiment, the controller 370 may provide instructions to a positioning robot 376 to place a sensor wafer 310 on the ESC 305. The sensor wafer 310 may be a sensor wafer similar to sensor wafers described above. For example, the sensor wafer 310 may comprise a plurality of pressure sensors 315 for measuring a chucking force of the ESC.

In an embodiment, the sensor information from the sensor wafer 310 may be obtained by the sensor interface 371 of the controller 370. For example, the sensor interface 371 may receive sensor information from the sensor wafer 310 (e.g., wirelessly with a wireless communication module). The controller 370 may utilize sensor information (e.g., chucking force) in a chucking force module 372 to determine a chucking force profile 374 across the ESC. The placement controller 370 may transmit the chucking force profile 374 to a database 375. In an embodiment, the chucking force profile 374 in the database may be referenced in the future to compare the changes in the chucking force profile 374 over time, to compare the chucking force profiles 374 across processing tools for chamber matching, and/or in the design of ESCs.

Figure 4A:
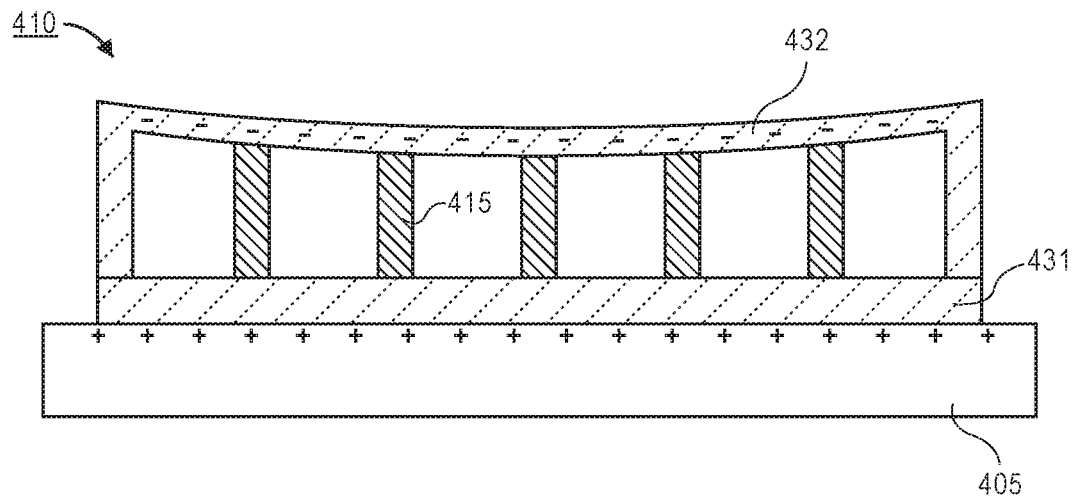
FIG. 4A is a cross-sectional illustration of the sensor wafer secured to an electrostatic chuck with the second substrate deflecting, in accordance with an embodiment.

Referring now to FIG. 4A, a cross-sectional illustration of a sensor wafer 410 that is secured to an ESC 405 is shown. As shown, the ESC includes a positive charge that attracts a negative charge of the sensor wafer 410. The first substrate 431 is entirely supported by the ESC 405 and will not deflect. However, the second substrate 432 includes an unsupported span that deflects towards the ESC 405. The deflection of the second substrate 432 induces a strain on the plurality of sensors 415. The amount of strain in each sensor 415 is provided as an electrical signal. The electrical signal, can therefore be used to determine the amount of deflection of the second substrate 432 at various locations across the sensor wafer 410. The deflection amount can be used to calculate the force applied by the ESC 405 at various locations across the substrate.

Figure 4B:
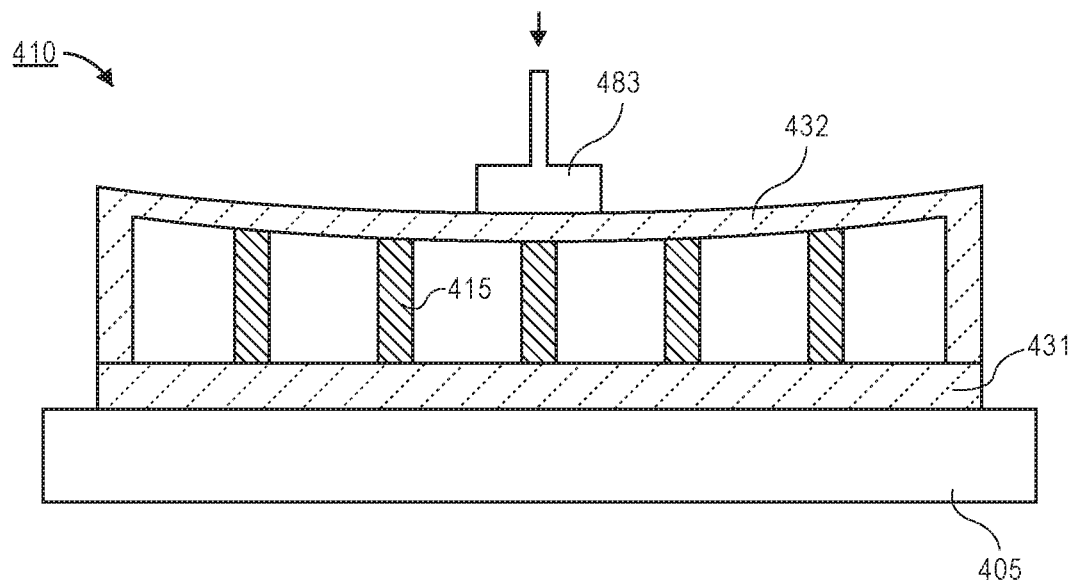
FIG. 4B is a cross-sectional illustration of the sensor wafer being polished, where the polishing head deflects the second substrate, in accordance with an embodiment.

Referring now to FIG. 4B, a cross-sectional illustration of a sensor wafer 410 that is undergoing a polishing operations (e.g., CMP) is shown, in accordance with an embodiment. In an embodiment, a polishing head 483 exerts a downward pressure (as indicated by the arrow) onto the second substrate 432. As a result of the downward pressure, the second substrate 432 deflects. The deflection of the second substrate 432 is measured by the sensors 415 with a process similar to that described above with respect to FIG. 4A. Accordingly, the sensor wafer 410 can provide a spatial representation of the force applied by the polishing head 483.

Figure 5:
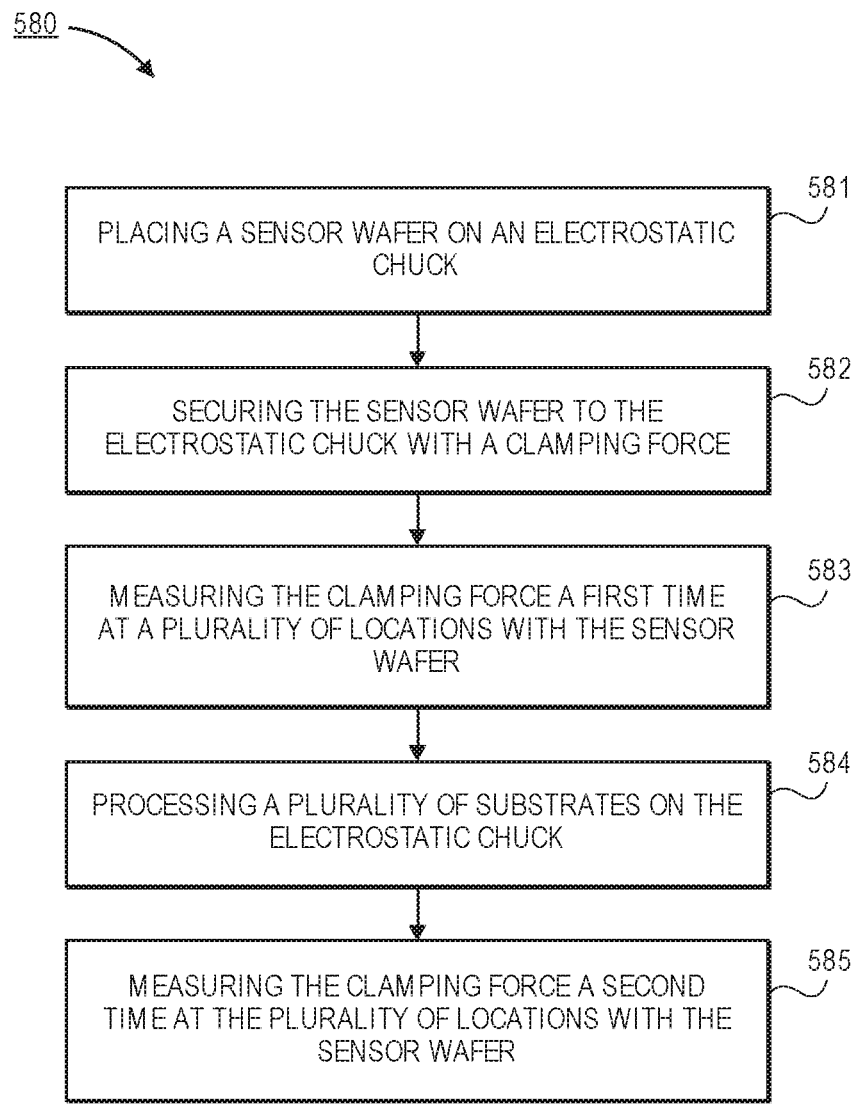
FIG. 5 is a flow diagram of a process for determining the chucking force of an electrostatic chuck, in accordance with an embodiment.

Referring now to FIG. 5, a process flow diagram of a process 580 for determining the chucking force of an ESC is shown, in accordance with an embodiment.

In an embodiment, process 580 may begin with operation 581 which comprises placing a sensor wafer on an ESC. In an embodiment, the sensor wafer may be any sensor wafer, such as those described herein. For example, the sensor wafer may comprise a plurality of pressure sensors embedded within the sensor wafer. In an embodiment, the sensors may be configured to measure a chucking force applied to the sensor wafer. In an embodiment, the sensor wafer may be placed on the ESC with a wafer handling robot.

In an embodiment, process 580 may continue with operation 582 which comprises securing the sensor wafer to the ESC with a clamping force. In an embodiment, the clamping force may comprise a voltage applied to the ESC that induces an electrostatic force between the sensor wafer and the ESC. In an embodiment, the clamping force may be a non-variable clamping force. For example, the voltage applied to the ESC may be held constant. In an additional embodiment, the clamping force may be variable. For example, the voltage may be increased and/or decreased in order to monitor the clamping force across different applied voltages.

In an embodiment, process 580 may continue with operation 583 which comprises measuring the clamping force a first time at a plurality of locations with the sensor wafer. In an embodiment, the clamping force may be measured at a single point in time. In an alternative embodiment, the clamping force may be measured as the voltage applied to the ESC is modulated in order to provide a measurement of the clamping force at a plurality of different voltages.

In an embodiment, process 580 may continue with operation 584 which comprises processing a plurality of substrates on the ESC. In an embodiment, the plurality of substrates may be device substrates (i.e., substrates on which devices are fabricated). For example, the substrates may be processed with a plasma process or the like.

In an embodiment, process 580 may continue with operation 585 which comprises measuring the clamping force a second time at the plurality of locations with the sensor wafer. For example, the sensor wafer may be reinserted into the processing chamber and placed on the ESC. In an embodiment, the same voltage (or voltages) applied to the ESC during the first measurement may be repeated, and a second measurement is taken. Accordingly, the sensor wafer provides a way to monitor the degradation of the clamping force after a given number of substrates have been processed.

In an embodiment, the comparison of the clamping force may be useful to monitor ESC degradation, to provide comparison between processing chambers (i.e., chamber matching), and/or to inform design choices in the manufacture of ESCs.

While explicit reference to electrostatic chucks (ESCs) is provided above, it is to be appreciated that embodiments are not limited to such configurations. For example, sensor wafers with pressure sensors such as those described herein may also be used to measure the chucking force profile for other types of chucks, such as vacuum chucks. That is, a vacuum force may compress the pressure sensors instead of an electrostatic force.

Figure 6:
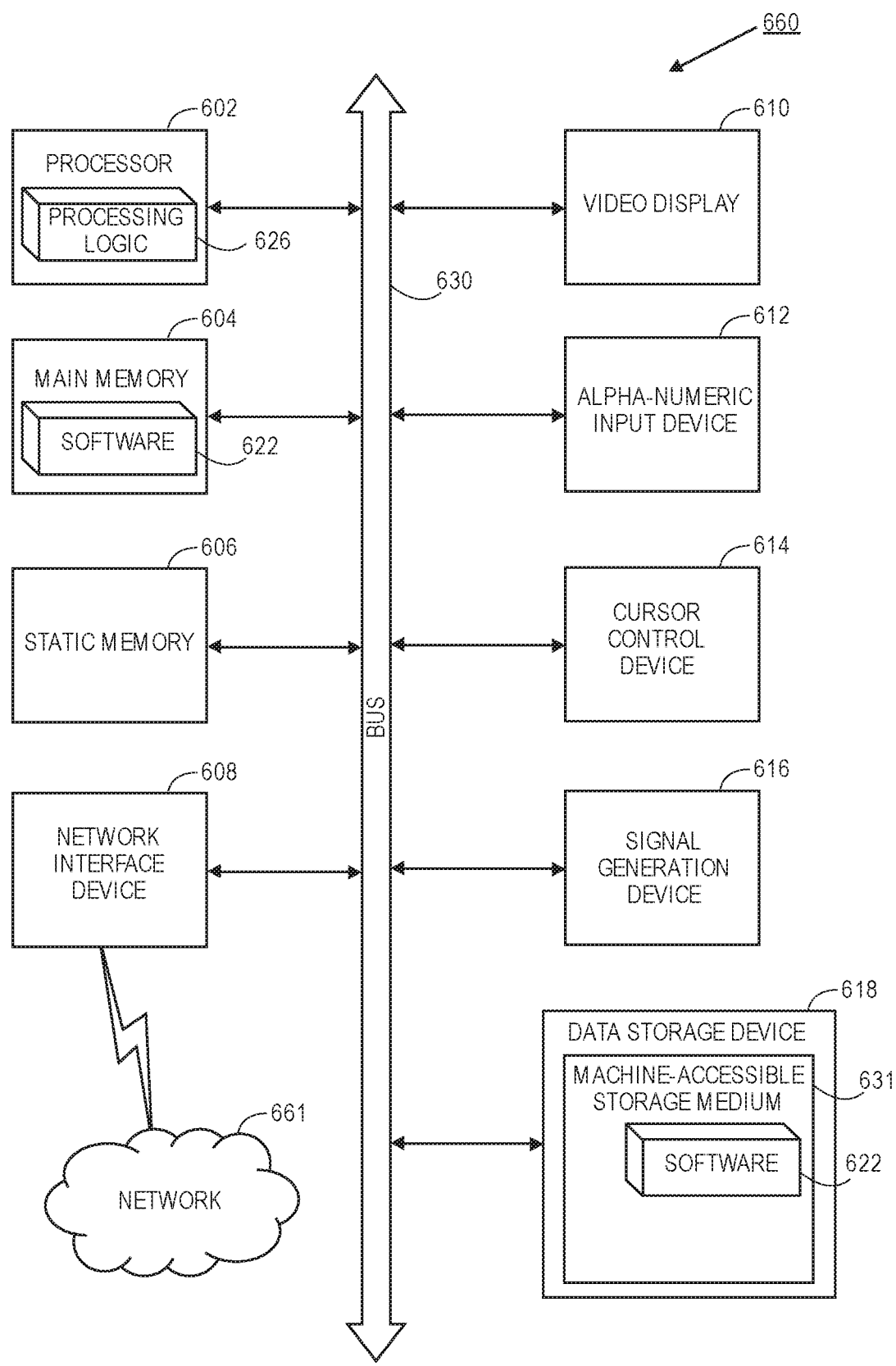
FIG. 6 illustrates a block diagram of an exemplary computer system that may be used in conjunction with processes that include determining the chucking force of an electrostatic chuck, in accordance with an embodiment.

Referring now to FIG. 6, a block diagram of an exemplary computer system 660 of a processing tool is illustrated in accordance with an embodiment. In an embodiment, the computer system 660 may be used as the controller. In an embodiment, computer system 660 is coupled to and controls processing in the processing tool. Computer system 660 may be connected (e.g., networked) to other machines in a network 661 (e.g., a Local Area Network (LAN), an intranet, an extranet, or the Internet). Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 661 via the system network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of measuring the chucking force of an electrostatic chuck, comprising:
    placing a sensor wafer onto the electrostatic chuck, wherein the sensor wafer comprises a plurality of pressure sensors, wherein the sensor wafer comprises a bottom substrate and a top substrate, and wherein each of the pressure sensors are positioned between a bottom pad on the bottom substrate and a top pad on the top substrate;
    applying a chucking voltage to the electrostatic chuck;

measuring the chucking force with the plurality of pressure sensors to determine a first chucking force profile of the electrostatic chuck;

processing a plurality of wafers on the electrostatic chuck;

placing the sensor wafer onto the electrostatic chuck;

applying the chucking voltage to the electrostatic chuck; and measuring the chucking force with the plurality of pressure sensors to determine a second chucking force profile of the electrostatic chuck.

2. The method of claim 1, further comprising:

comparing the first chucking force profile with the second chucking force profile.

3. The method of claim 1, wherein the chucking voltage is a range of voltages.

4. The method of claim 1, wherein the pressure sensors are embedded in the sensor wafer.

5. The method of claim 1, wherein a cavity is formed between the bottom substrate and the top substrate.

6. The method of claim 1, wherein the pressure sensors are spring gauge sensors.

7. The method of claim 1, wherein the bottom substrate and the top substrate are silicon substrates.

8. The method of claim 1, further comprising:

comparing the first chucking profile to a chucking profile of a second electrostatic chuck.

9. The method of claim 1, wherein the plurality of sensors are arranged across a surface of the sensor wafer.

10. A sensor wafer, comprising:

a first substrate;

a second substrate over the first substrate, wherein surfaces of the first substrate and the second substrate define a cavity between the first substrate and the second substrate; and a plurality of discrete pressure sensors in the cavity, wherein each of the discrete pressure sensors is electrically coupled to a corresponding first pad on the first substrate and a corresponding second pad on the second substrate.

11. The sensor wafer of claim 10, wherein the plurality of discrete pressure sensors is a plurality of spring gauge sensors.

12. The sensor wafer of claim 10, wherein the plurality of discrete pressure sensors is electrically coupled to a computing module embedded in one of the first or second substrate.

13. The sensor wafer of claim 12, wherein the computing module further comprises a battery.

14. The sensor wafer of claim 13, wherein the computing module further comprises a wireless communication interface.

15. A method of measuring the chucking force of an electrostatic chuck, comprising:

placing a sensor wafer onto the electrostatic chuck, wherein the sensor wafer comprises:

a first substrate;

a second substrate over the first substrate, wherein surfaces of the first substrate and the second substrate define a cavity between the first substrate and the second substrate; and a plurality of pressure sensors in the cavity, wherein each of the pressure sensors are electrically coupled to a first pad on the first substrate and a second pad on the second substrate;

applying a chucking voltage to the electrostatic chuck; and measuring the chucking force with the plurality of pressure sensors to determine a first chucking force profile of the electrostatic chuck.

16. The method of claim 15, wherein the plurality of sensors are placed within a cavity formed between the first substrate and the second substrate.

17. The method of claim 16, wherein the cavity is hermetically sealed.

* * * * *